US012640541B2

(12) United States Patent
Nevou et al.

(10) Patent No.: US 12,640,541 B2
(45) Date of Patent: May 26, 2026

(54) LASER SENSOR AND METHOD OF MANUFACTURING A LASER SENSOR

(71) Applicant: ams International AG, Jona (CH)

(72) Inventors: Laurent Nevou, Wadenswil (CH); Jean Francois Seurin, West Windsor, NJ (US); Svenja Mauthe, Altendorf (CH); Jens Geiger, Thalwil (CH)

(73) Assignee: AMS INTERNATIONAL AG, Jona (CH)

( * ) Notice: Subject to any disclaimer, the term of this patent is extended or adjusted under 35 U.S.C. 154(b) by 838 days.

(21) Appl. No.: 17/892,389

(22) Filed: Aug. 22, 2022

(65) Prior Publication Data

US 2024/0063607 A1 Feb. 22, 2024

(51) Int. Cl.
| | |
|---|---|
| *H01S 5/00* | (2006.01) |
| *H01S 5/026* | (2006.01) |
| *H01S 5/125* | (2006.01) |
| *H01S 5/183* | (2006.01) |
| *G01B 9/02* | (2022.01) |
| *G01S 7/4912* | (2020.01) |

(52) U.S. Cl.
CPC ........ *H01S 5/18358* (2013.01); *H01S 5/0028* (2013.01); *H01S 5/0264* (2013.01); *H01S 5/125* (2013.01); *H01S 5/183* (2013.01); *H01S 5/18361* (2013.01); *G01B 9/02* (2013.01); *G01B 9/02092* (2013.01); *G01S 7/4916* (2013.01)

(58) Field of Classification Search
CPC .............. H01S 5/18358; H01S 5/0028; H01S 5/0264; H01S 5/125; H01S 5/183; H01S 5/18361; G01B 9/02092; G01S 7/4916
See application file for complete search history.

(56) References Cited

U.S. PATENT DOCUMENTS

| | | | | |
|---|---|---|---|---|
| 2010/0134803 A1* | 6/2010 | Baier | ...................... | H01S 5/141 |
| | | | | 356/450 |
| 2012/0200858 A1* | 8/2012 | Pruijmboom | ...... | G01B 9/02092 |
| | | | | 356/477 |
| 2019/0090068 A1* | 3/2019 | Fishman | ............... | H01S 5/0028 |

(Continued)

OTHER PUBLICATIONS

Serkland et al., "Narrow Linewidth VCSELs for High-Resolution Spectroscopy", http://www.sandia.gov/, 2009, 8 pages.

(Continued)

*Primary Examiner* — Kinam Park
(74) *Attorney, Agent, or Firm* — MH2 Technology Law Group LLP

(57) ABSTRACT

A self-mixing interferometric, SMI, laser sensor comprises a vertical cavity surface emitting laser, VCSEL, configured to emit laser radiation, the VCSEL comprising a first distributed Bragg reflector, DBR, a second DBR and a cavity region including an active light generation region, wherein the cavity region is arranged in a layer structure between a front side of the first DBR and a back side of the second DBR. Therein at least one of the first and second DBR comprises a first contrast region and a second contrast region, the first contrast region having a first refractive index contrast $\Delta n_1$ regarding an emission wavelength of the VCSEL and the second contrast region having a second refractive index contrast $\Delta n_2/n$ larger than the first refractive index contrast $\Delta n_1/n$.

15 Claims, 8 Drawing Sheets

(56)  References Cited

U.S. PATENT DOCUMENTS

| | | | |
|---|---|---|---|
| 2021/0003385 A1* | 1/2021 | Tan | H01S 5/18313 |
| 2021/0057883 A1 | 2/2021 | Seurin et al. | |
| 2021/0104873 A1* | 4/2021 | Gerlach | G01B 9/02092 |
| 2021/0223027 A1* | 7/2021 | Johnson | G01S 7/4814 |
| 2022/0094137 A1* | 3/2022 | Weichmann | H01S 5/0421 |
| 2023/0089141 A1* | 3/2023 | Chen | H01S 5/18311 |
| | | | 356/450 |
| 2023/0396037 A1* | 12/2023 | Vadiee | G01S 7/4814 |

OTHER PUBLICATIONS

Unold, "Improving Single-Mode VCSEL Performance by Introducing a Long Monolithic Cavity", Annual Report 1999, Dept. of Optoelectronics, University of Ulm, 1999, 5 pages.

Unold et al., "Improving Single-Mode VCSEL Performance by Introducing a Long Monolithic Cavity", IEEE Photonics Technology Letters, vol. 12, No. 8, Aug. 2000, 3 pages.

* cited by examiner

FIG 3
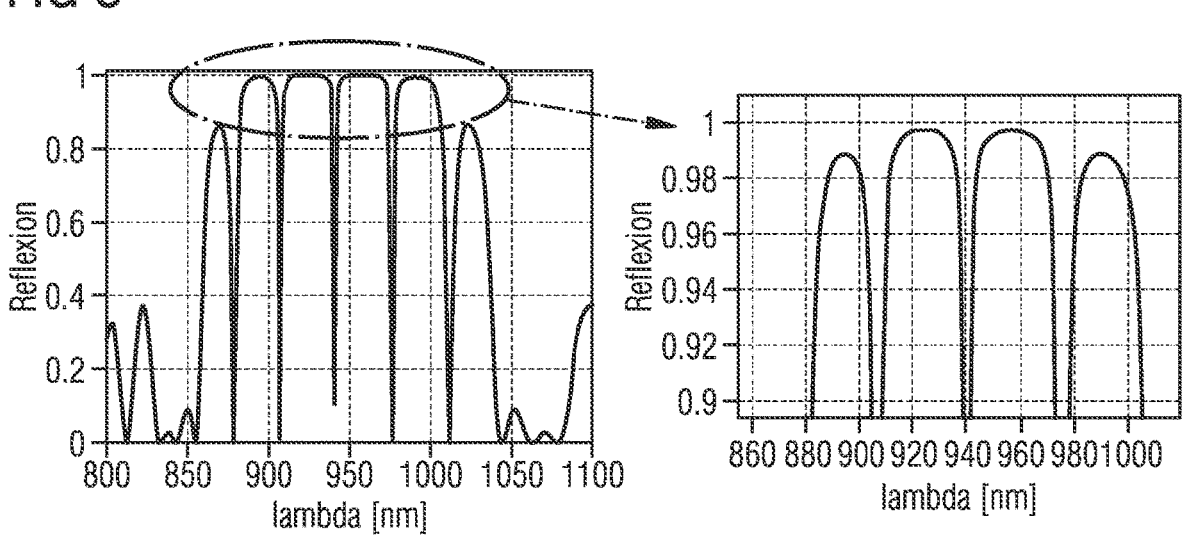
FIG 4
FIG 5
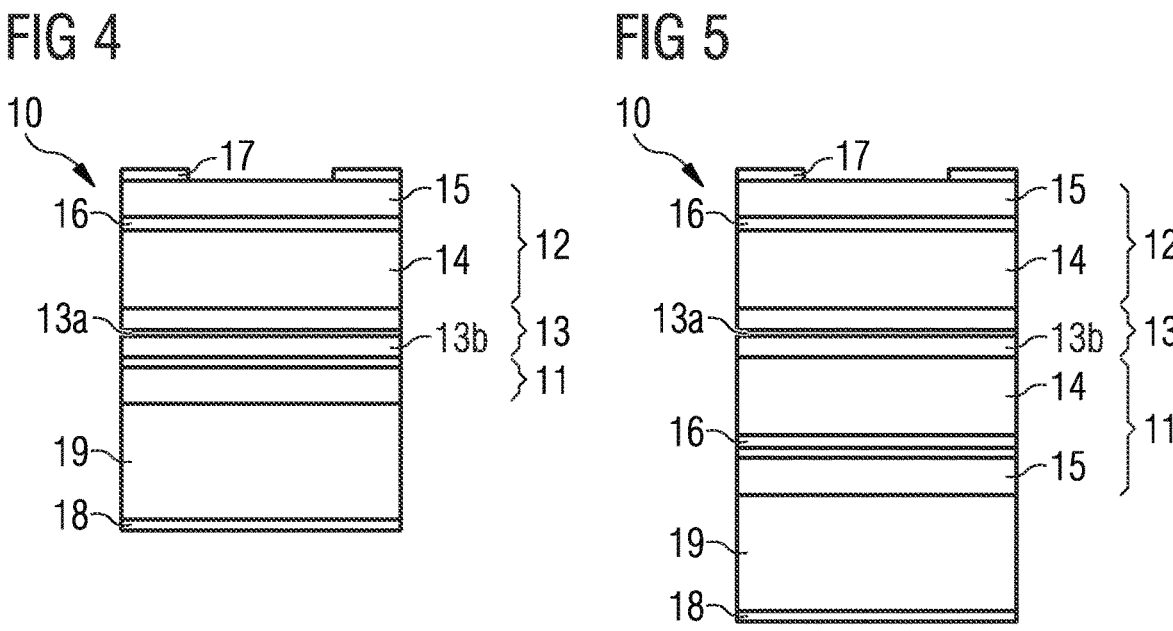

FIG. 6 a) PRIOR ART
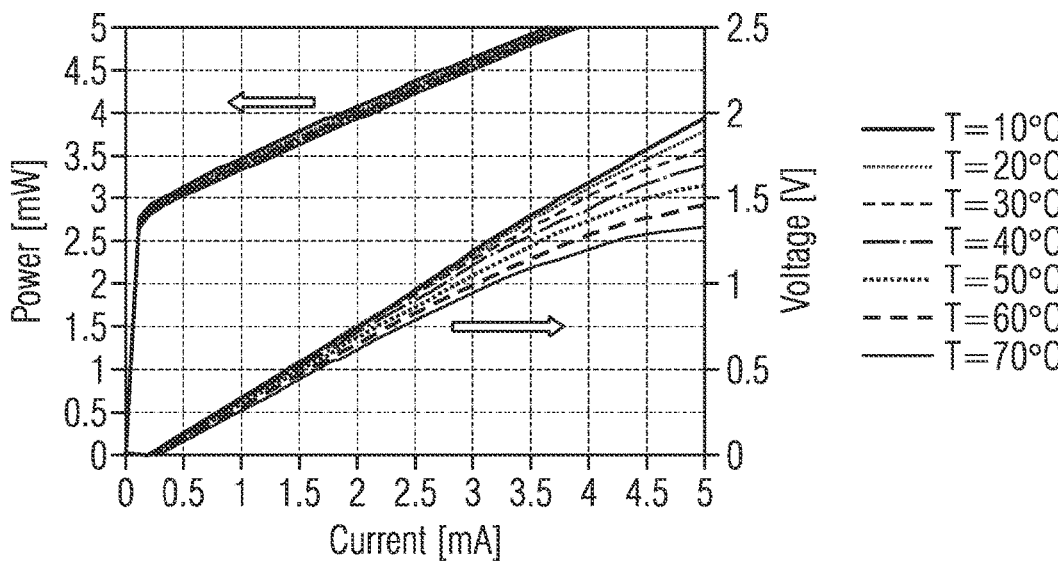
FIG. 6 b)
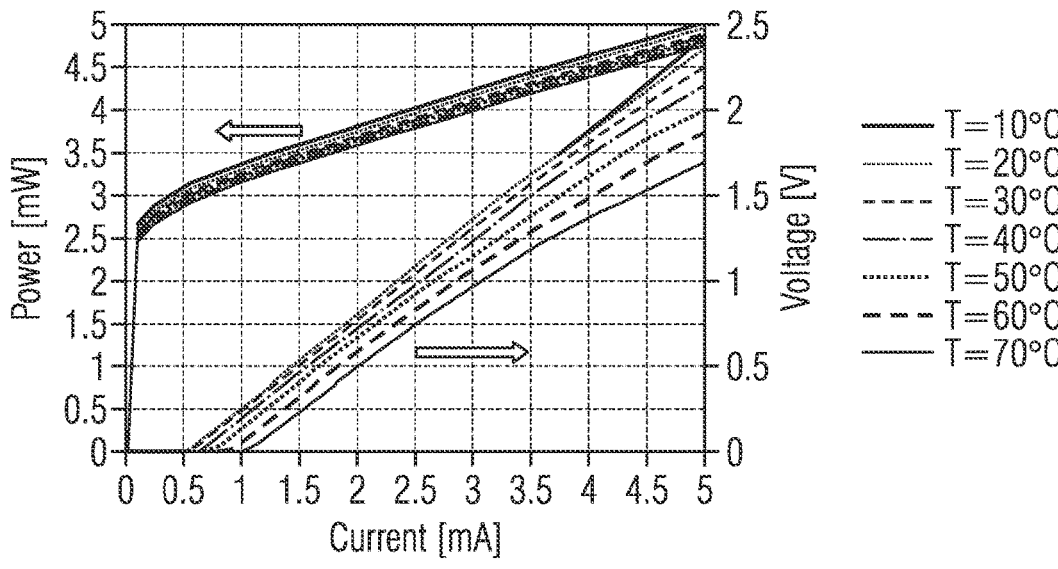

FIG. 7a)  PRIOR ART
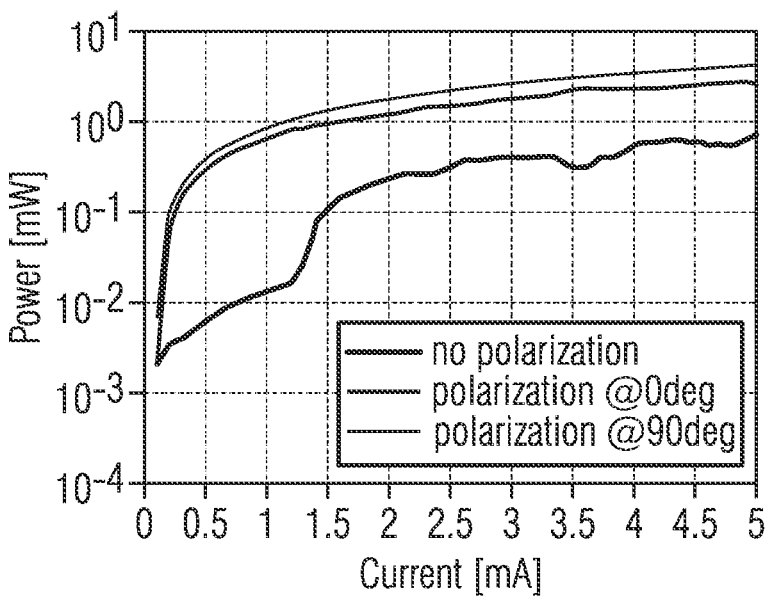
FIG. 7b)
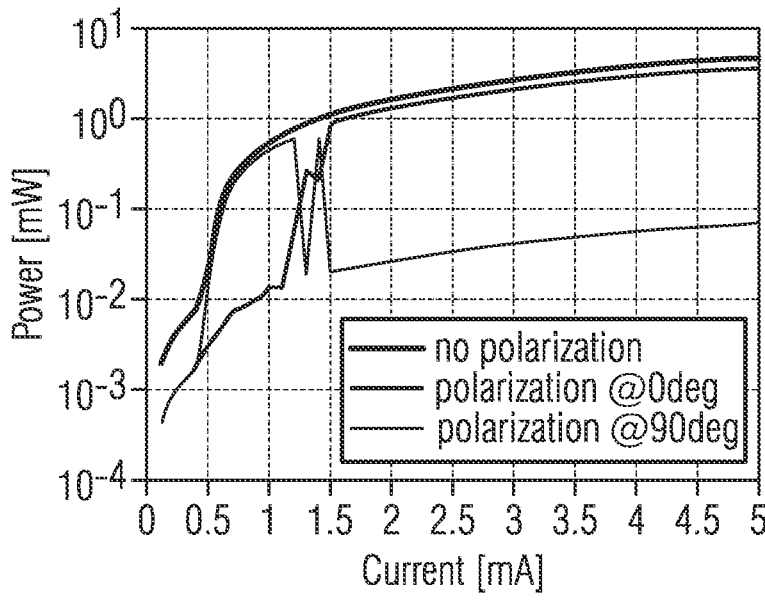

FIG. 8a) PRIOR ART
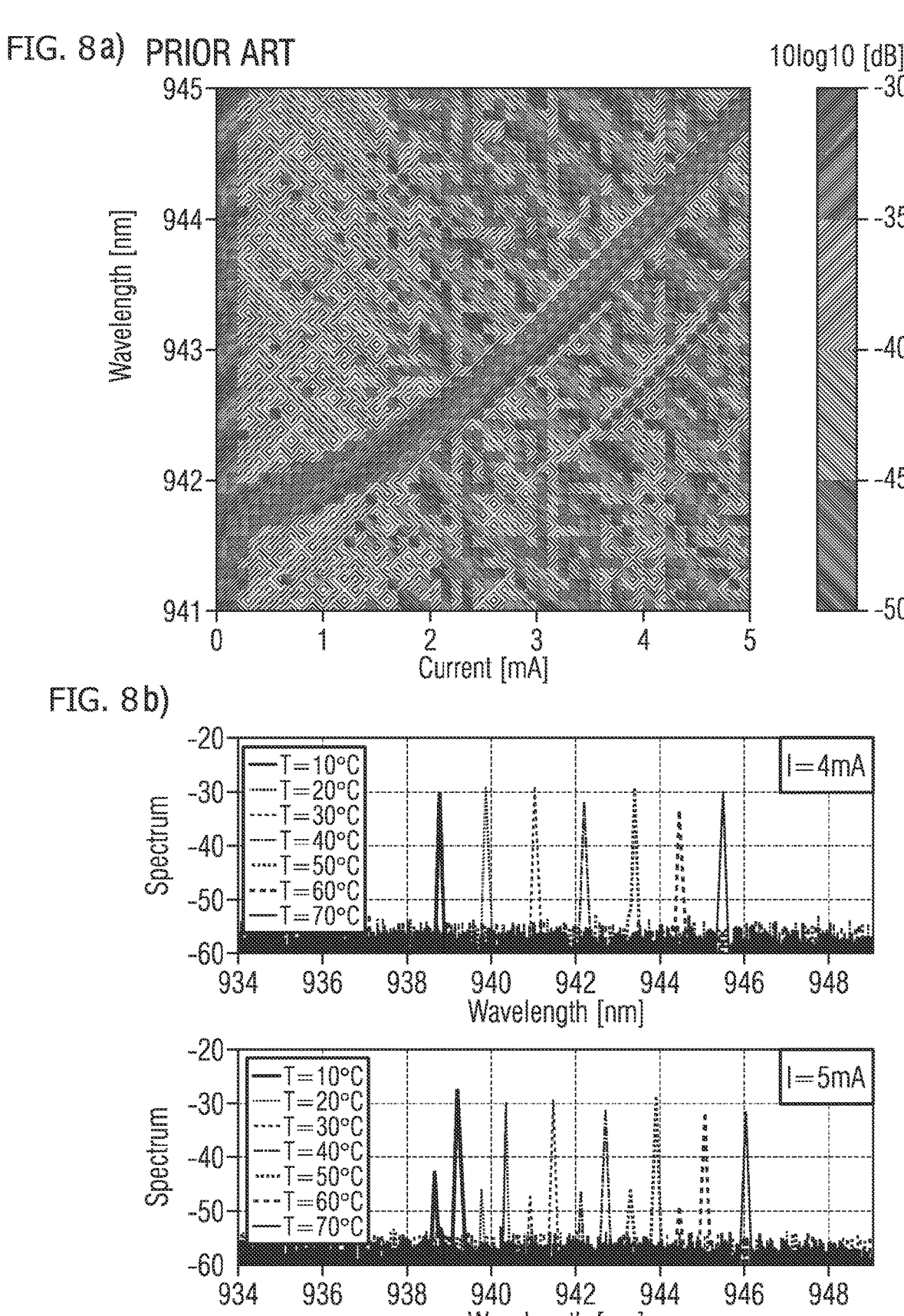

FIG. 9 a)  PRIOR ART
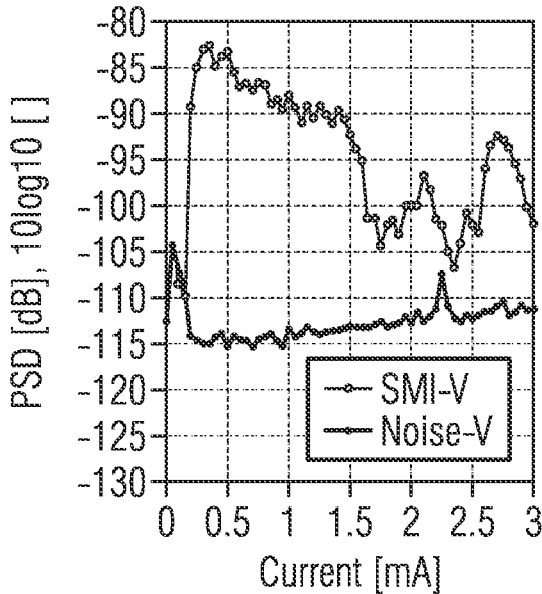
FIG. 9 b)
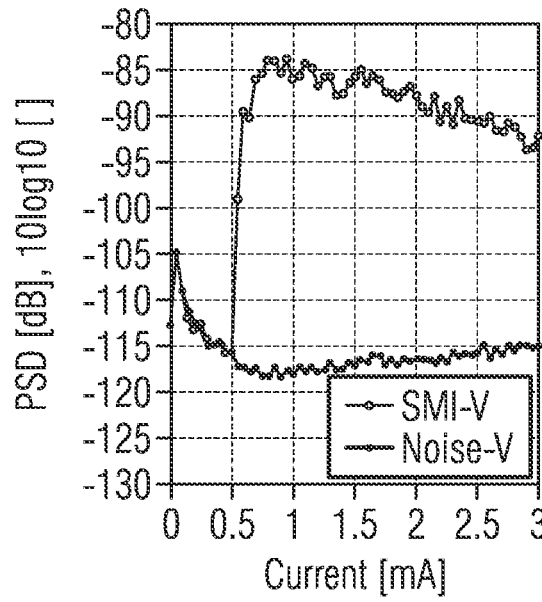

LASER SENSOR AND METHOD OF MANUFACTURING A LASER SENSOR

FIELD

This disclosure relates to a self-mixing interferometric laser sensor, to an electronic device comprising such a laser sensor, and to a manufacturing method of an SMI laser sensor.

BACKGROUND OF THE INVENTION

Optical self-mixing interferometry (SMI) sensors provide the possibility of measuring absolute and relative distances as well as vibrations and velocities of objects and thus enable an employment in a wide range of applications. Therein, SMI laser sensors rely on the interferometric effect of laser light, which is reflected or scattered back from an object or a scene in the field-of-view of the sensor and re-enters the laser cavity, with the resonating radiation inside the cavity. As a result, the output properties of the laser, such as the output power and a junction voltage is influenced by the self-mixing interference. In particular, the resulting output power or frequency variations contain traceable information on the movement or distance of the target object with respect to the sensor.

State-of-the-art SMI laser sensors typically employ semiconductor lasers as the light source. The effective cavity length in such devices commonly depends on an applied current via the temperature of the laser device. In particular, the output frequency of semiconductor lasers basically instantaneously follows any current variations due to the simultaneously changed optical resonator length. Hence, by applying a defined current shape, e.g. a periodic saw tooth or triangular current, the resulting difference in frequency between the resonating and the back-scattered light can be evaluated in a suitable evaluation unit and translated back to a desired position or velocity information, for instance.

Vertical-cavity surface-emitting lasers, VCSEL, being the most prominent choice in SMI sensors, comprise a gain region that is sandwiched between two distributed Bragg reflectors, DBR, acting as end mirrors and for feeding current into the gain region. Typically, one of the DBR is highly reflective with a reflectivity in excess of 99.9%, while the other has a lower reflectivity for enabling out coupling of light through an emission surface of the VCSEL. In an SMI sensor, this lower reflectivity DBR also serves as input port for the laser light that is received from the object or scene such that the light can be reinjected into the cavity via the emission surface. VCSELs have the advantage that their surface-emitting properties render them suitable for production and testing on a wafer level in large quantities, which opens the possibility of a low-cost production process. Furthermore, the output power can be scaled to a certain extent via the area of the emitting surface.

However, presently employed VCSELs are limited in terms of a maximum current allowable before the laser stops its single-mode operation. This limits the maximum allowed modulation amplitude applied to the laser current, in turn setting an upper limit to a maximum distance resolution that can be achieved with the SMI sensor. Specifically, at some specific current, higher order transversal mode start to lase inside the VCSEL resulting in the SMI signal becoming unstable and difficult to read out due to the superposition of multi-wavelength.

An approach to suppress the transversal mode in a VCSEL is to elongate the cavity length in order to make the resonator more stable also at larger applied currents and modulation amplitudes. Simply extending the cavity length, however, brings the disadvantage of an increased bandwidth, due to which additional longitudinal modes become supported such that again a multi-mode emission behavior is expected to occur.

Thus, it is an object to be achieved to provide an SMI laser sensor with increased distance resolution and distance range that overcomes the limitations of state-of-the-art devices. It is further an object to provide a manufacturing method of such an SMI laser sensor.

These objects are achieved with the subject-matter of the independent claims. Further developments and embodiments are described in dependent claims.

SUMMARY OF THE INVENTION

This disclosure overcomes the abovementioned technical limitations by providing a SMI laser sensor that comprises a VCSEL, in which at least one of the DBRs comprises a low contrast region that efficiently acts as cavity extension and as a filter for maintaining a limited bandwidth. This way, a VCSEL is provided, which can be driven with significantly higher currents and current modulations while maintaining the single mode operation that is crucial for self-mixing interferometry. With the capability of applying larger current modulations, a significantly enhanced resolution in distance measurements is achieved. In addition, the effectively extended cavity also leads to an increase of the of coherence length of the VCSEL, in turn likewise increasing the range of the SMI laser sensor, in which distances can be determined.

Specifically, a self-mixing interferometry laser sensor comprises a vertical cavity surface emitting laser, VCSEL, that is configured to emit laser radiation, wherein the VCSEL comprises a first distributed Bragg reflector, DBR, a second DBR and a cavity region including an active light generation region, wherein the cavity region is arranged in a layer structure between a front side of the first DBR and a back side of the second DBR. At least one of the first and second DBR comprises a first contrast region and a second contrast region, the first contrast region being formed from a plurality of layers of alternating first materials having a first refractive index contrast $\Delta n_1/n$ regarding an emission wavelength of the VCSEL and the second contrast region being formed from a plurality of layers of alternating second materials having a second refractive index contrast $\Delta n_2/n$ larger than the first refractive index contrast $\Delta n_1/n$. Therein, the refractive index contrast is defined by the difference of the refractive indices of the alternating material layers divided by their mean value. Moreover, the SMI laser sensor further comprises an evaluation unit configured to monitor the laser radiation of the VCSEL.

The VCSEL has a vertical laser cavity that is formed between the front side of the first DBR and the back side of the second DBR. In other words, the first and second DBRs act as end mirrors with the laser cavity being formed by the cavity region that is sandwiched in between. The cavity region comprises an active light generation region that is formed by an active laser medium, often also called a gain medium, as the source of optical gain required in a laser. The VCSEL emits electromagnetic radiation through a partially transmissive end mirror, e.g. through the second DBR such that a top side of the second DBR facing away from the cavity region acts as emission surface. Therein, the first and second DBR are designed for a specific emission wavelength or emission wavelength range of the VCSEL.

In some embodiments, the VCSEL can have two-sided emission, such that also the first DBR is partially transmissive. The laser can be arranged on a substrate, e.g., a CMOS silicon die, such that a bottom side of the VCSEL, i.e., a second emission surface in case of two-sided emission, is parallel to and faces the substrate. The substrate can comprise laser contacts for electrically connecting the laser to a laser driver, and a photosensitive element that is arranged on a substrate surface or integrated within the substrate as an embedded photodetector in case of two-sided emission, for instance. In such embodiments, a photosensitive surface of the photosensitive element faces a back side of the first DBR, i.e. a bottom surface of the VCSEL, and can thus receive electromagnetic radiation that is emitted by the laser through the bottom emission surface. The photosensitive element can be arranged distant from the bottom emission surface or it is in contact with the latter.

The VCSEL is configured to undergo self-mixing interference in its cavity. This means that light that is emitted by the VCSEL through the emission surface and reflected or scattered by an object or a scene arranged distant to the laser sensor can re-enter the laser cavity via re-injection through the emission surface causing the self-mixing interference. Self-mixing interference in turn causes an alteration, e.g. modulation, of the optical power in the laser cavity and thus of the laser output power. This effect of the self-mixing interference can be monitored via the above-mentioned optional photodetector or via electrical properties of the VCSEL, e.g. a bias current or a junction voltage.

At least one of the first and second DBRs features a first contrast region and a second contrast region. The two regions are characterized by a low contrast of refractive index in the first contrast region and a high contrast of refractive index in the second contrast region. The terms 'high' and 'low' hereby and throughout this disclosure indicate that the low and high contrasts are distinct and differ by more than mere tolerances. Here and throughout the disclosure, the term 'contrast' refers to a difference in refractive indices of the alternating material layers forming the respective portion of the DBR. Thus, the materials forming the alternating layers in the first contrast region have refractive indices that are closer to each other compared to the refractive indices of the materials forming the alternating layers in the second contrast region. Thus, the first contrast region can be regarded a low contrast region, while the second contrast region can be regarded a high contrast region. The low and high contrast regions of the DBR effectively form a DBR arrangement comprising a low contrast DBR arranged adjacent to a high contrast DBR. The first and/or second DBR comprising the low and high contrast regions can therefore be regarded a system of two DBRs.

The evaluation unit comprises means to determine a degree of self-mixing interference in the laser cavity. For example, the evaluation unit optically measures an output power of the VCSEL via a second emission port by means of a photodetector or via an electrical property of the laser via monitoring a bias current or junction voltage of the VCSEL.

In at least one embodiment, the first contrast region is arranged between the second contrast region and the cavity region. The low contrast region of the DBR is characterized by a lower reflectivity compared to the high contrast region. Therein, arranging a low contrast region on at least one side of the laser cavity sandwiched between the latter and the high contrast region of the same DBR, effectively extends the length of the laser cavity, in turn increasing the single-mode performance of the VCSEL. This way, a higher output power can be achieved compared to VCSELs with a shorter cavity length while still maintaining single mode operation. Moreover, increasing the effective cavity length leads to a decrease of the optical linewidth of the VCSEL and therefore to an increase of the coherence length. This means that the SMI laser sensor can operate at larger distances to a scene or object. Compared to a conventional cavity extension realized by means of a transparent spacer or buffer, the low contrast region arranged between the high contrast region and the cavity region is characterized by a low bandwidth and hence efficiently suppresses the buildup of additional longitudinal optical modes. Thus, the low contrast DBR enhances the single mode operation to significantly larger output powers by both, extending the cavity length and reducing the bandwidth of the laser.

In some embodiments, the cavity region further comprises a cavity extension region arranged between the active light generation region and the first or second DBR. In addition to extending the cavity via the above-mentioned low contrast region of at least one of the first and second DBRs, a further enhancement of the single mode operation of the VCSEL can be achieved by means of a buffer or transparent spacer. For example, the cavity region comprises a gain region that is arranged embedded or adjacent to a transparent buffer.

In some embodiments, the first refractive index contrast $\Delta n_1/n$ is smaller than 10%, in particular smaller than 6%. Similarly, the second refractive index contrast $\Delta n_2/n$ can be larger than 10%, in particular larger than 16%. Therein, the refractive index contrast is defined by the difference of the refractive indices of the alternating material layers divided by their mean value. Engineering the low contrast region via alternating material layers, wherein the two materials differ in terms of refractive index at the emission wavelength by less than 0.3, or even less than 0.2, for a mean refractive index of about 3.45 means a significantly lower contrast compared to regular DBRs employed as end mirrors in VCSELs, which typically feature contrasts of 17-20%, i.e. differences in terms of refractive index, of 0.5 or larger. Analogously, the high contrast region can be engineered from materials featuring a contrast of 10% or larger. The exact first and second refractive index contrasts as well as their difference can depend on the desired specifications of the SMI laser sensor and hence on the specific application. Specifically, a large contrast means a high reflectivity while a low contrast can help to reduce an optical bandwidth as detailed above.

In some embodiments, each of the first and the second DBRs comprises a respective first contrast region and second contrast region. Design both the first and second DBRs as system of DBRs comprising low and high contrast regions further increases an effective cavity length while potentially reducing the bandwidth of the VCSEL, which in turn leads to larger bias currents that can be applied without losing the single-mode operation of the VCSEL. Therein, the low contrast region of each of the first and second DBRs can be arranged between, e.g. sandwiched, between the cavity region and the high contrast region of the respective one of the first and second DBRs. For example, the low contrast regions of the first and second DBRs can have the same properties, i.e. be formed from the same materials, layer number and layer thicknesses, for instance. The high contrast regions of the first and second DBRs can differ in their properties, e.g. for realizing different reflectivity values. For two-sided emission, the high contrast regions of the first and second DBRs can alternatively have the same properties.

In some embodiments, the first contrast region is formed from alternating layers of GaAs and AlGaAs, GaAs and InGaAs, or AlGaAs and InGaAs, in particular from alternating layers of GaAs and $Al_xGa_{1-x}As$ with $x \leq 0.5$. Gallium arsenide has a refractive index at 940 nm of about 3.6. Aluminum gallium arsenide has a refractive index at 940 nm of 3.0 to 3.5 depending on the aluminum fraction in the $Al_xGa_{1-x}As$ alloy. Preferably, an AlGaAs alloy is chosen with $x \leq 0.5$. Similarly, the refractive index at an optical wavelength of 940 nm of indium gallium arsenide is between 3.5 and 3.7 depending on the indium fraction in the $In_xGa_{1-x}As$ alloy. Thus, by choosing appropriate compositions of the alloys, a low contrast of refractive indices of the alternating material layers in the low contrast portion can be achieved.

In some embodiments, the second contrast region is formed from alternating layers of AlAs and one of: GaAs, AlGaAs, and InGaAs. The refractive index of aluminum arsenide at 940 nm is about 3.0. Thus, the high contrast portion of the DBR can be efficiently realized using AlAs with any of the other compounds and appropriate alloy compositions. Alternatively, the high contrast region can be formed from AlGaAs as the material layer with low refractive index. Other material choices are likewise possible, particularly for emission wavelengths other than 940 nm.

In some embodiments, the emission wavelength of the VCSEL is in the infrared domain, in particular in the NIR domain comprising 940 nm. Typically TOF distance measurements and mappings are preferably operated at optical wavelengths that are invisible to a user of the device. A wavelength of 940 nm situated in the NIR portion of the electromagnetic spectrum has proven to be a suitable candidate as high efficient and cost effective optical components are available or can be manufactured at this wavelength.

In some embodiments, the VCSEL is characterized by single mode operation for a diode current up to 3 mA, in particular up to 5 mA. Conventional VCSEL devices employed in presently available SMI laser sensors typically begin a multi-mode operation at diode currents of about 1.5 mA, thus limiting maximum modulation amplitudes in distance measurements, and hence limiting the resolution of the sensor. In contrast, the effective extension of the optical cavity in combination with the low bandwidth introduced by means of the at least one low contrast region can increase the maximum allowable bias current by a factor of at least two and increase the window of single-mode emission to currents up to 5 mA and even above. Here, a tradeoff has to be tailored to the application requirements in terms of overall thickness of the VCSEL device and its optical performance. In particular, the ability to introduce a modulation of the laser current with an amplitude increase of a factor of 10 likewise leads to a resolution of the distance measurement by the same factor, i.e. by an order of magnitude.

In some embodiments, the evaluation unit comprises a photodetector configured to detect changes in properties of the emitted laser radiation, in particular in the emitted light intensity, due to self-mixing interference. The Detection of the SMI laser sensor can be configured to optically detect and monitor the SMI formed inside the laser cavity. As mentioned above, the SMI leads to a modulation of the laser output power. Thus a photodetector can be employed that monitors an output power of the VCSEL for determining a degree of SMI formed in the cavity. To this end, an optical element acting as a pickup mirror, e.g. a beam splitter, on the emission side can be employed to divert a certain fraction of the emitted light to a photodetector.

Moreover, the VCSEL can be characterized by two-sided emission and the photodetector is arranged on a back side of the first DBR. Alternatively to the above-mentioned procedure, the VCSEL can be characterized by two-sided emission such that the photodetector can monitor the output power of the VCSEL via a second emission surface, e.g. via a bottom surface of the VCSEL.

In some embodiments, the evaluation unit is configured to detect changes in a junction voltage of the VCSEL due to self-mixing interference. Alternatively or in addition to an optical detection of the output power, the evaluation unit can comprise means to monitor a junction voltage or a bias current of the VCSEL, which likewise is modulated alongside the formation of SMI inside the cavity. Thus, a monitoring of such an electrical property can likewise be used to determine a degree of SMI and therefore to evaluate he distance measurement.

Moreover, an electronic device comprising a SMI laser sensor according to one of the abovementioned embodiments is provided, wherein the SMI laser sensor is configured to measure an absolute distance, a relative distance, and or a velocity of an object distant from the electronic device in the field-of-view of the SMI laser sensor. The electronic device can be a mobile or portable device including a smartphone, a tablet computer, a laptop computer or a wearable accessory such as a smart wristband, a smartwatch or an earphone device.

Moreover, a method of manufacturing a SMI laser sensor is provided. The method comprises providing a vertical cavity surface emitting laser, VCSEL, configured to emit laser radiation. Providing the VCSEL comprises providing a first distributed Bragg reflector, DBR, arranging a cavity region on a front side of the first DBR, the cavity region including an active light generation region, and arranging a second DBR on a front side of the cavity region. The method further comprises providing an evaluation unit configured to monitor the laser radiation of the VCSEL. Providing at least one of the first and second DBR comprises forming a first contrast region and a second contrast region, the first contrast region being formed from a plurality of layers of alternating materials having a first refractive index contrast $\Delta n_1/n$ regarding an emission wavelength of the VCSEL and the second contrast region being formed from a plurality of layers of alternating materials having a second refractive index contrast $\Delta n_2/n$ larger than the first refractive index contrast $\Delta n_1/n$.

For example, the method comprises arranging the first contrast region between the second contrast region and the cavity region.

Further embodiments of the method become apparent to the skilled reader from the aforementioned embodiments of the optical sensor element, the thermal image sensor, and the electronic device, and vice-versa.

BRIEF DESCRIPTION OF THE DRAWINGS

The following description of figures may further illustrate and explain aspects of the SMI laser sensor and the method of manufacturing an SMI laser sensor. Components and parts of the SMI laser sensor that are functionally identical or have an identical effect are denoted by identical reference symbols. Identical or effectively identical components and parts might be described only with respect to the figures where they occur first. Their description is not necessarily repeated in successive figures.

In the figures:

FIG. 3 illustrates cavity properties of an exemplary embodiment of a VCSEL for a proposed laser sensor;

FIGS. 4 and 5 are schematic views of a second and third exemplary embodiment of a VCSEL;

FIGS. 6a, 6b, 7a, 7b, 8a, 8b, 9a, and 9b compare key properties of a VCSEL according to the improved concept and a prior art VCSEL;

DETAILED DESCRIPTION

Figures 1, 2:
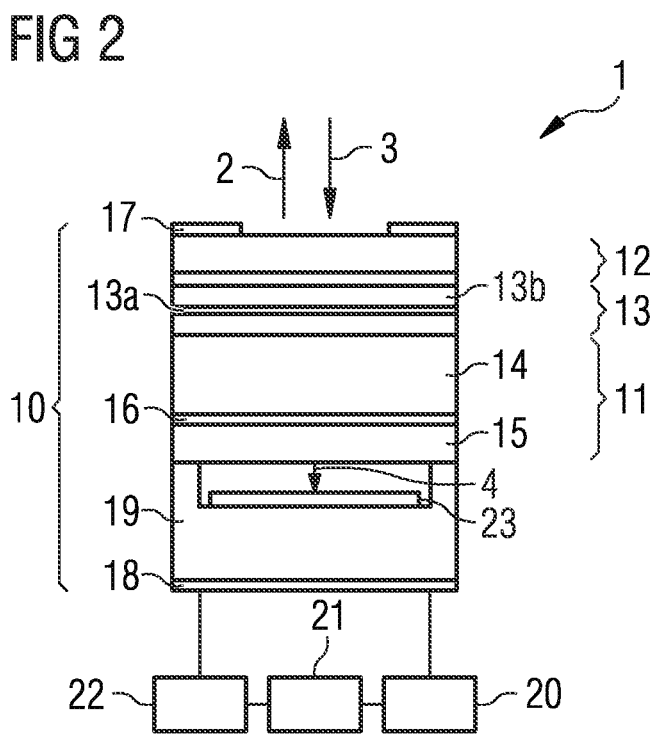
FIG. 1 is a schematic view of a first exemplary embodiment of a proposed laser sensor.
FIG. 2 is a schematic view of a second exemplary embodiment of a proposed laser sensor.

FIG. 1 shows a first embodiment of a self-mixing interference laser sensor 1 according to the improved concept. The laser sensor 1 comprises a first exemplary embodiment of a vertical-cavity surface-emitting laser 10. In this exemplary embodiment, the VCSEL 10 comprises of a VCSEL layer structure formed by a cavity region 13 that is embedded between a first distributed Bragg reflector 11 and a second distributed Bragg reflector 12, forming a laser cavity. The cavity region 13 comprises an electrically pumped gain medium 13a and an optional cavity extension 13b, i.e. a transparent non-active medium. The gain medium 13a can be embedded in the cavity extension 13b as depicted. Alternatively, the gain medium 13a can be arranged adjacent to the cavity extension 13b. The first DBR 11 is a stacked arrangement of a first contrast region 14 and a second contrast region 15, optionally separated by a spacer 16. The second contrast region 15 is highly reflective, for single-sided emission preferably with a reflectivity>99.5%, at an emission wavelength of the VCSEL 10, e.g. 940 nm. The second DBR 12 is characterized by a smaller reflectivity for allowing the emission of light 2. In other words, a top side of the second DBR 12 facing away from the cavity region 13 acts as emission surface of the VCSEL 10. The first DBR 11 is p-doped, while the second DBR is n-doped, or vice versa, for allowing efficient current feeding into the cavity region 13.

The first contrast region 14 is arranged in between the second contrast region 15 and the cavity region 13 and is characterized by a refractive index contrast $\Delta n_1/n$ that is smaller than the refractive index contrast $\Delta n_2/n$ of the second contrast region 15. Therein, the refractive index contrast $\Delta n/n$ is defined as a difference in refractive indices regarding the alternating material layers forming said contrast region divided by their mean value. For example, the second contrast region 15 is formed from alternating layers of a first material with a refractive index at 940 nm of about 3.0, e.g. AlAs, and a second material with a refractive index at 940 nm of about 3.6, e.g. GaAs, leading to a refractive index contrast $\Delta n_2/n$ of about 18%. As a result, about 20 pairs are required to achieve a reflectivity of 99.5%. A number of 45 pairs would lead to a reflectivity of 99.95%.

In contrast, the first contrast region 14 is formed from alternating layers of a first material with a refractive index at 940 nm of about 3.6, e.g. GaAs, and a second material with a refractive index at 940 nm of about 3.3, e.g. $Al_{0.5}Ga_{0.5}As$, leading to a refractive index contrast $\Delta n_1/n$ of about 8.7%. Even smaller contrasts can be achieved by reducing the composition of $Al_xGa_{1-x}As$ with x<0.5. Basically, the refractive index of $Al_xGa_{1-x}As$ can be approximated by n=−0.6x+3.6. Alternative material choices for the first and second contrast regions 14, 15 include AlGaAs and InGaAs in various compositions. Typical thicknesses of the individual layers forming the first and second contrast regions 14, 15 are in the order of the optical emission wavelength of the VCSEL 10 divided by 4 times the respective refractive index. Both the first and second contrast region are formed from a plurality of alternating layers, typically between 20 and 50 pairs of alternating material layers.

Thus, the first contrast region 14 can be regarded as a low contrast DBR that is arranged on a front surface of a high contrast DBR facing the cavity region 13. The high contrast DBR formed from the second contrast region 15 is characterized by a high reflectivity, while the first contrast region 14 is characterized by a lower reflectivity in comparison, but also by a lower bandwidth regarding the emission wavelength of the VCSEL 10. Effectively, the low contrast region acts as a cavity extension, increasing the length of the laser cavity and therefore the coherence length, leading to a larger distance the SMI laser sensor can operate at. Additionally, the low contrast first region 14 due to the cavity extension allows for an increased stability without additional longitudinal modes starting to lase. This is due to the fact that additional modes have higher losses due to the small bandwidth of the first contrast region 14 having a low contrast. Thus, the VCSEL 10 compared to conventional devices can be operated at higher currents while maintaining single mode operation, an essential requirement for efficient SMI detection.

The operating current for current injection into the gain medium 13a is provided by a current source unit 22 that is coupled to the VCSEL. The laser sensor further comprises a control unit 21 that is coupled to the current source 22 for applying a modulation to the operating current, wherein the modulation of the operating current leads to a frequency modulation of the emitted light. The working principle of an SMI laser sensor for determining absolute or relative distances is a well-established concept and is not further detailed throughout this disclosure. However, it is noted that the performance of an SMI laser sensor is determined by its maximum operating current (and thus a maximum range of current modulation) while maintaining single mode operation, and by the coherence length of the emitted light indicating a maximum range of the laser sensor.

The laser sensor 1 further comprises an evaluation unit 20 that monitors the output intensity of the VCSEL, e.g. via monitoring the junction voltage of the VCSEL 10 that is modulated alongside the output power, indicating a degree of self-mixing interference. Therein, the back-scattered or reflected radiation 3 from the target object influences the wavelength of the emitted radiation 2, which translates to an influence of the output power and in turn of the junction voltage of the VCSEL 10. For monitoring the junction voltage, the evaluation unit 20 for communication purposes is coupled to the control unit 21 and is configured to determine a distance (relative or absolute) and/or a velocity to an object or scene the emitted radiation 2 is reflected or backscattered from. A comparison between conventional VCSELs employed in SMI laser sensors and a VCSEL according to the improved concept is detailed in FIGS. 6 to 9.

The laser sensor 1 can further comprise an aperture layer 17, e.g. an oxide aperture layer, for defining an emission window of the VCSEL 10 and/or for limiting light above a cut-off angle from reentering the cavity. Moreover, the VCSEL 10 can comprise a metallization layer 18 for defining electrical contacts and terminals of the VCSEL 10, for instance. The VCSEL 10 can be arranged on a substrate body 19. Since this proposed VCSEL structure allows the efficient suppression of higher order modes, the oxide aperture of the VCSEL can be increased in order to reduce a serial resistance Rs and reduce the noise level in the SMI voltage readout. Moreover, the proposed VCSEL structure also allows for a narrower beam divergence, which can be beneficial in some applications.

FIG. 2 shows a second embodiment of a self-mixing interference laser sensor 1 according to the improved concept. Compared to the first embodiment, the readout of the self-mixing interference is performed in the optical domain in this second embodiment. To this end, the laser sensor 1 further comprises a photosensitive element 23, e.g. a photodiode, and the VCSEL 10 is configured to perform two-sided emission through both the first and second DBR 11, 12. The photodetector 23 can be embedded in or arranged on a surface of the substrate body 19 and is coupled to the evaluation unit 20. Like the emitted light 2 through the front side of the VCSEL 10, the emitted light 4 through the back side likewise carries information about self-mixing interference formed inside the laser cavity. In other words, upon undergoing SMI, the backside emitted light 4 also is modulated in terms of its output power such that monitoring this emission gives information about a degree of SMI in the cavity.

For enabling two-sided emission, the second contrast region 15 of the first DBR 11 is characterized by a slightly lower reflectivity such that a portion of the light can leave the cavity through the first DBR 11 on a backside of the VCSEL 10. Alternatively to the depicted setup, a pickup element in the beam path of the emitted light 2 can divert some of the emitted light 2 to a photodetector 23 in cases, in which the VCSEL is characterized by single-sided emission.

FIG. 3 illustrates the effect of the low contrast region formed by the first contrast region 14 that acts as a (further) cavity extension and as a bandwidth filter. As seen in the left panel, due to the elongated cavity, additional longitudinal modes apart from the target mode at 940 nm could potentially form as the cavity extension decreases the free spectral range of the VCSEL 10. Particularly, in this example two further modes at 910 nm and 970 nm appear to be supported, which would begin to lase at a threshold current if the cavity was extended using a regular buffer as extension. However, due to the first contrast region 14 being a low-contrast DBR, as depicted in the right panel, the additional modes feature an overall lower reflectivity compared to the target optical mode. Although this difference seems miniscule, such small differences in reflections are sufficient to suppress an optical mode from lasing. Hence, the VCSEL 10 according to the improved concept can be operated at significantly larger operating currents compared to conventional VCSELs while maintaining single-mode emission.

FIG. 4 shows a further exemplary embodiment of a VCSEL 10 employed in an SMI laser sensor 1 according to the improved concept. Compared to the embodiment of the VCSEL 10 of FIG. 1, in this embodiment the first DBR 11 is a regular high contrast DBR acting as an end mirror, while the second DBR 12 is characterized by a first contrast region 14, e.g. a low contrast region, and a second contrast region 15, e.g. a high contrast region, according to the improved concept. Embodiments, in which the top DBR has the two different contrast regions can be beneficial from a manufacturing point of view.

FIG. 5 shows a further exemplary embodiment of a VCSEL 10 employed in an SMI laser sensor 1 according to the improved concept. In this embodiment, both the first DBR 11 and the second DBR 12 comprise respective first and second contrast regions 14, 15. Therein, the contrast region with the lower refractive index contrast, i.e. the first contrast region 14, is arranged within the respective DBR 11, 12 facing the cavity region 13, while the second contrast region, acting as end mirrors, are arranged facing away from the cavity region 13. Embodiments, in which both the first and second DBR 11, 12 feature a low and high contrast region further increase the cavity length and thus the coherence length, while the dual low contrast region can further aid to suppress the buildup of unwanted optical modes due to the small bandwidth of these low contrast regions.

FIGS. 6 to 9 in the respective panels (b) illustrate key aspects of a 940 nm VCSEL 10 according to the improved concept, while comparing these to the corresponding characteristics of an existing 940 nm VCSEL devices with similar specs but without any low contrast region, i.e. with two regular DBR end mirrors, shown in the respective panels (a). FIG. 6 illustrates an LIV measurement obtained at different temperatures, in which the optical output power and junction voltage in dependence of an applied operating current. As can be discerned, both the conventional VCSEL and the VCSEL 10 according to the improved concept experiences a similar behavior in terms of these two quantities. Thus, the added low contrast region 14 does not significantly alter the performance of the VCSEL 10.

FIG. 7 illustrates the single mode behavior obtained by means of a polarized output power measurement to discern the contribution of different modes to the total measured power. As can be seen, a VCSEL 10 according to the improved concept experiences single mode operation at a significantly larger scale at currents beyond 5 mA, whereas a conventional VCSEL starts its multimode behavior, i.e. the point at which an additional mode comes within 10 dB of the target mode, already at around 1.3 mA, above which no SMI measurements can reliably be performed. It is noted that in the VCSEL of panel (b) a polarization flip can potentially occur, however, the single mode operation remains stable, hence ensuring a reliable SMI operation even at large (modulation) currents.

FIG. 8 shows spectra for illustrating single and multimode domains of operation. For a conventional VCSEL, higher order longitudinal modes appear at an operating current of about 2.5 mA making an SMI measurement extremely difficult or even impossible. The VCSEL 10 according to the improved concept, however, even at currents of 5 mA shows a suppression of higher order modes in excess of 20 dB as shown for different temperatures.

FIG. 9 finally compares the SMI signal and noise amplitudes between a laser sensor 1 employing a conventional VCSEL and a VCSEL 10 according to the improved concept. Due to the onset of higher order modes in conventional SMI laser sensors, the signal-to-noise ratio significantly decreases already at operating currents of 1.5 mA, thus seriously limiting the maximum modulation amplitude. A VCSEL 10 according to the improved concept, however, due to its multimode operation beyond operating currents of 5 mA still shows significant SNR and thus enables long-range high-resolution measurements due to the extended cavity and capability to apply larger modulation amplitudes to the operating current.

Figure 10A:
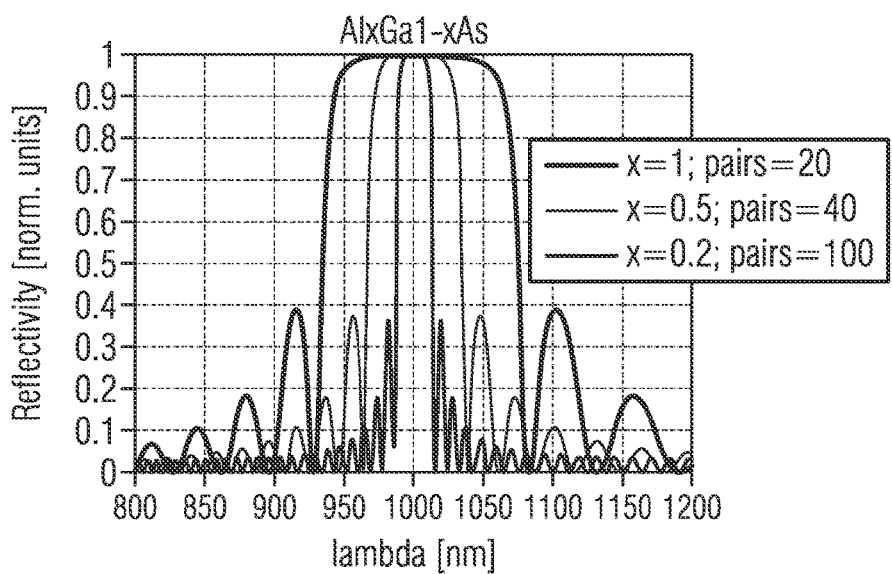
FIGS. 10a and 10b illustrate the reflectivity behavior of a low contrast region depending on alloy composition and number of layer pairs of an embodiment of a VCSEL.
Figure 10B:
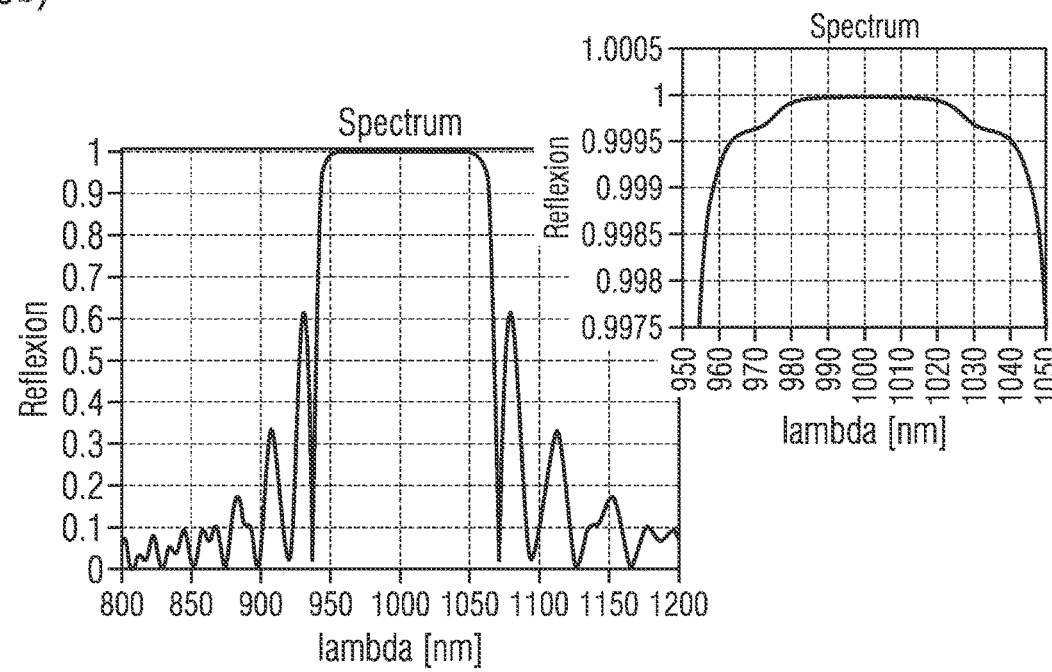

FIG. 10 in panel (a) shows the aforementioned reflectivity behavior of a first contrast region 14 formed from alternating layers of GaAs, having a refractive index of 3.6 at 940 nm, and $Al_xGa_{1-x}As$ for different compositions and therefore different refractive indices. As can be seen, the lower the aluminum content, indicating a higher refractive index according to the approximation n=−0.6x+3.6, the smaller the refractive index contrast $\Delta n_1/n$ of the first contrast region 14 and the lower the bandwidth. Reducing the contrast, however, significantly reduces the reflectivity which can be compensated by means of increasing the number of layer pairs such that a high reflectivity close to unity with small bandwidth can be achieved. Panel (b) shows the reflection spectrum of a DBR, e.g. the first DBR 11 of FIG. 1, comprising 30 pairs of AlAs/GaAs pairs in the second contrast region 15 and 30 pairs of $Al_{0.5}Ga_{0.5}As/GaAs$ pairs forming the first contrast region 14 facing the cavity region 13. Therein, the low bandwidth efficiently suppresses the onset of higher order optical modes from lasing.

Figure 11:
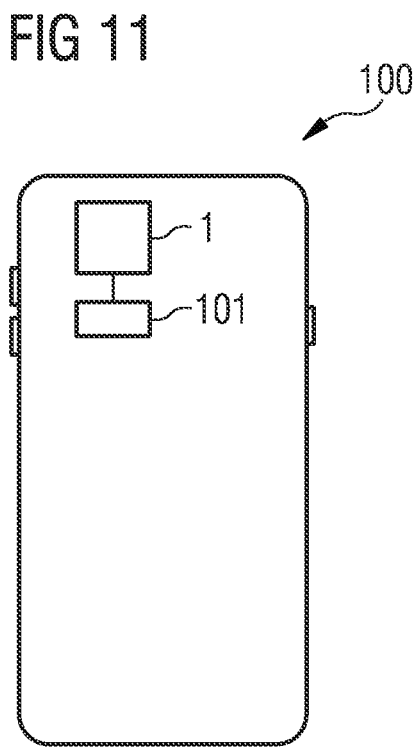
FIG. 11 is a schematic view of an electronic device comprising a proposed laser sensor.

FIG. 11 shows an embodiment of an electronic device 100 comprising an SMI laser sensor 1 according to the improved concept. For example, the electronic device 100 is a smart phone, as depicted. Alternatively, the electronic device can be any portable or mobile electronic device including tablet or laptop computers, augmented or virtual reality glasses, smartwatches or other wearable devices or dedicated distance sensor.

The embodiments of the SMI laser sensor 1, the electronic device 100 and the method of manufacturing an SMI laser sensor 1 disclosed herein have been discussed for the purpose of familiarizing the reader with novel aspects of the idea. Although preferred embodiments have been shown and described, changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

REFERENCES 1 laser sensor
2 emitted radiation
3 reflected or scattered radiation
4 emitted radiation
10 vertical cavity surface emitting laser
11, 12 distributed Bragg reflector
13 cavity region
13a active light generation region
13b cavity extension region
14, 15 contrast region
16 spacer
17 aperture layer
18 metallization layer 19 substrate body
20 evaluation unit
21 control unit
22 current source unit
23 photodetector

The invention claimed is:

1. A self-mixing interferometric, SMI, laser sensor, comprising:
   a vertical cavity surface emitting laser, VCSEL, configured to emit laser radiation, the VCSEL comprising a first distributed Bragg reflector, DBR, a second DBR and a cavity region including an active light generation region, wherein the cavity region is arranged in a layer structure between a front side of the first DBR and a back side of the second DBR; and
   an evaluation unit configured to monitor the laser radiation of the VCSEL;
   wherein at least one of the first and second DBR comprises a first contrast region and a second contrast region,
   wherein the first contrast region is formed from a plurality of layers of alternating first materials having a first refractive index contrast $\Delta n_1/n$ regarding an emission wavelength of the VCSEL and the second contrast region is formed from a plurality of layers of alternating second materials having a second refractive index contrast $\Delta n_2/n$ regarding an emission wavelength of the VCSEL,
   wherein the refractive index contrast corresponds to a difference of refractive indices of the alternating material layers divided by their mean value, and
   wherein the second refractive index contrast $\Delta n2/n$ is larger than the first refractive index contrast $\Delta n_1/n$.

2. The SMI laser sensor according to claim 1, wherein the first contrast region is arranged between the second contrast region and the cavity region.

3. The SMI laser sensor according to claim 1, wherein the cavity region further comprises a cavity extension region arranged between the active light generation region and the first or second DBR.

4. The SMI laser sensor according to claim 1, wherein the first refractive index contrast $\Delta n_1/n$ is smaller than 10%, in particular smaller than 6%.

5. The SMI laser sensor according to claim 1, wherein the second refractive index contrast $\Delta n_2/n$ is larger than 10%, in particular larger than 16%.

6. The SMI laser sensor according to claim 1, wherein each of the first and the second DBRs comprises a respective first contrast region and second contrast region.

7. The SMI laser sensor according to claim 1, wherein the first contrast region is formed from alternating layers of GaAs and AlGaAs, GaAs and InGaAs, or AlGaAs and InGaAs, in particular from alternating layers of GaAs and $Al_xGa_{1-x}As$ with x≤0.5.

8. The SMI laser sensor according to claim 1, wherein the second contrast region is formed from alternating layers of AlAs and one of: GaAs, AlGaAs, and InGaAs.

9. The SMI laser sensor according to claim 1, wherein the emission wavelength of the VCSEL is in the infrared domain, in particular in the NIR domain comprising 940 nm.

10. The SMI laser sensor according to claim 1, wherein the VCSEL is characterized by single mode operation for a diode current up to 3 mA, in particular up to 5 mA.

11. The SMI laser sensor according to claim 1, further comprising a photodetector coupled to the evaluation unit and configured to detect changes in properties of the emitted laser radiation, in particular in the emitted light intensity, due to self-mixing interference.

12. The SMI laser sensor according to claim 11, wherein the VCSEL is characterized by two-sided emission and the photodetector is arranged on a back side of the first DBR.

13. The SMI laser sensor according to claim 1, wherein the evaluation unit is configured to detect changes in a junction voltage of the VCSEL due to self-mixing interference.

14. An electronic device comprising a SMI laser sensor according to claim 1, wherein the SMI laser sensor is configured to measure an absolute distance, a relative distance, and or a velocity of an object distant from the electronic device in the field-of-view of the SMI laser sensor.

15. A method of manufacturing a SMI laser sensor, the method comprising:

providing a vertical cavity surface emitting laser, VCSEL, configured to emit laser radiation, wherein providing the VCSEL comprises:

providing a first distributed Bragg reflector, DBR;

arranging a cavity region on a front side of the first DBR, the cavity region including an active light generation region; and arranging a second DBR on a front side of the cavity region; and providing an evaluation unit configured to monitor the laser radiation of the VCSEL;

wherein providing at least one of the first and second DBR comprises forming a first contrast region and a second contrast region, wherein the first contrast region is formed from a plurality of layers of alternating materials having a first refractive index contrast $\Delta n_1/n$ regarding an emission wavelength of the VCSEL and the second contrast region is formed from a plurality of layers of alternating materials having a second refractive index contrast $\Delta n_2/n$ regarding an emission wavelength of the VCSEL, wherein the refractive index contrast corresponds to a difference of refractive indices of the alternating material layers divided by their mean value, and wherein the second refractive index contrast $\Delta n2/n$ is larger than the first refractive index contrast $\Delta n_1/n$.

\* \* \* \* \*